United States Patent [19]

Chippel

[11] 4,353,108

[45] Oct. 5, 1982

[54] FRAME ASSEMBLY FOR ELECTRONIC COMPONENTS

[75] Inventor: Bob M. Chippel, Toronto, Canada

[73] Assignee: Canadian General Electric Company Limited, Toronto, Canada

[21] Appl. No.: 194,053

[22] Filed: Oct. 6, 1980

[51] Int. Cl.³ .............................................. H05K 7/20
[52] U.S. Cl. ................................ 361/386; 174/52 PE;
361/419
[58] Field of Search ................... 174/52 PE; 361/331,
361/380, 386, 398, 417, 419, 420, 427, 428,
387–389

[56] References Cited

U.S. PATENT DOCUMENTS

| | | | |
|---|---|---|---|
| 2,590,821 | 3/1952 | Kiser | 174/52 PE |
| 2,647,224 | 7/1953 | Bruck | 361/398 |
| 2,990,500 | 6/1961 | Mierendorf | 361/420 |
| 4,104,701 | 8/1978 | Baranowski | 361/386 |

FOREIGN PATENT DOCUMENTS 2257888  5/1974  Fed. Rep. of Germany ... 174/52 PE

*Primary Examiner*—Gerald P. Tolin
*Attorney, Agent, or Firm*—Ernest W. Legree; Philip L. Schlamp; Fred Jacob

[57] ABSTRACT

The present invention provides a dielectric paper frame structure suitable for use in a shell-type housing for supporting a small number of discrete electronic components in spaced-apart, non-contacting and electrically insulating relation from the walls of the housing. The frame structure comprises a thin elongated unitary piece of dielectric paper having two opposing major surfaces and two edges in contact with opposing walls of the housing. Along the edges of the frame structure there are provided substantially V-shaped slots which receive non-insulated leads of the electrical components such that the electrical components are located between the edges of the frame structure. The novel paper frame structure replaces a printed circuit board.

8 Claims, 5 Drawing Figures

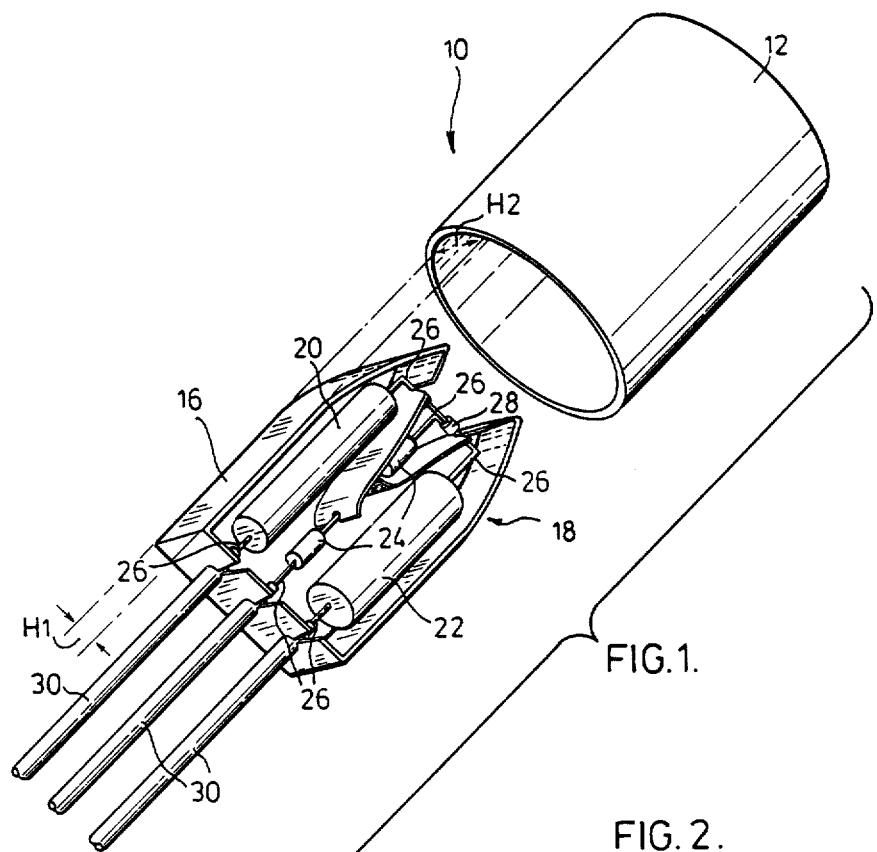
FIG. 1.
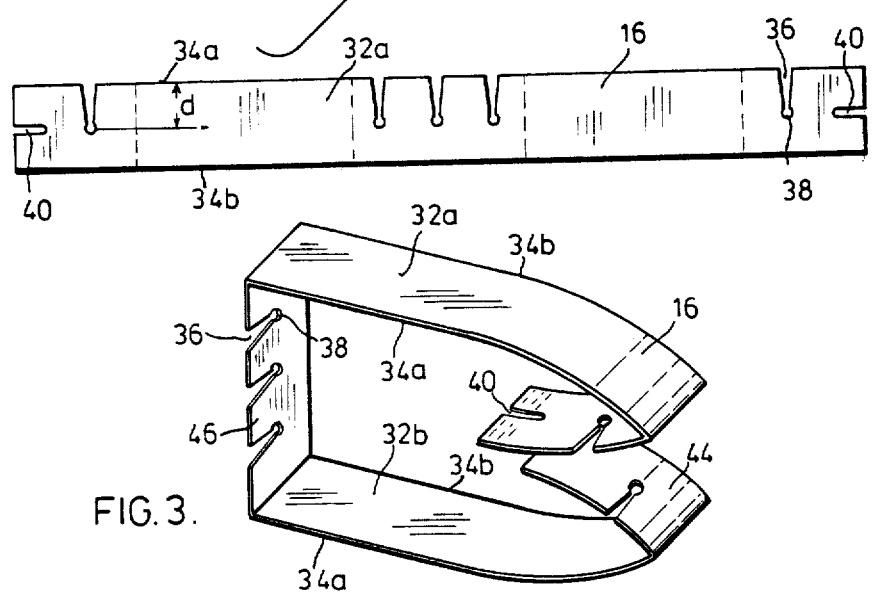
FIG. 2.
FIG. 3.

FRAME ASSEMBLY FOR ELECTRONIC COMPONENTS

The present invention relates to the potting of discrete electronic components within a shell-type housing. In particular, it relates to a dielectric frame structure surrounding the components and supporting the components within the housing.

The term "frame structure" is referred to throughout the specification and claims. It is to be understood that the term frame structure referred to in the specification and claims means: "an open case or structure made for enclosing and supporting electronic components."

Shell-type housings, such as aluminum cans, are employed to protect the electronic components from the environment. Commonly, a small number of discrete electronic components are wired onto and are supported by a flat printed circuit board. Before the circuit board is inserted into the aluminum can, a sheet of dielectric paper is wrapped around the inner surface of the walls of the housing. The dielectric paper, commonly referred to as "a wrapper", ensures that the printed circuit board and the electronic components it supports do not electrically contact the walls of the can. After the wrapper is positioned adjacent the walls of the can and prior to the printed circuit board being inserted into the can, an epoxy potting compound is poured into the can. After the epoxy compound cures, it becomes a thermally conducting and electrically insulating material providing heat transfer between the electronic components and the walls of the can.

The life expectancy and reliability of the electronic components "potted" within the can is dependent upon the temperature at which the electronic components operate. The cooler the operating temperature of the electronic components remains, the longer the life expectancy of the electronic components becomes. However, the electronic components, potted within the can, frequently operate at relatively high temperatures, which temperatures affect their durability and reliability. Relatively high operating temperatures for the electronic components may be caused by the presence of an air gap between the dielectric wrapper and the walls of the can. The air gap has a considerably lower value of thermal conductivity relative to the value of thermal conductivity for the potted compound and, as a result, the overall heat transfer efficiency between the electronic components and the walls of the can is diminished. Another factor leading to the overall heat transfer relationship being diminished is that often an air gap exists between an electronic component and the printed circuit board.

As can be appreciated, the use of a printed circuit board adds a significant material cost to the assembly of the electronic components within the can. Furthermore, the utilization of a printed circuit board requires that the flux, located on one surface of the board, be removed by a cleaning solvent. This solvent is a health hazard because of its toxic fumes which are emitted when the solvent is applied to the printed circuit board.

Also, the leads of the electronic components are soldered together. The soldering operation produces lead fumes which are a recognized health hazard. As a result, the soldering operation requires special ventilation at each work station where the operation is being performed.

It is therefore a feature of the present invention to provide a housing for discrete electronic components that has improved thermal conductivity characteristics.

It is another feature of the present invention to provide a housing for discrete electronic components that eliminates the disadvantages associated with printed circuit boards.

It is a further feature of the present invention to provide a housing for discrete electronic components wherein the operation of interconnecting the electronic components is not subject to the disadvantages of a soldering operation.

Briefly, the present invention provides a housing for one or more discrete electronic components where a dielectric frame structure is employed. The frame structure surrounds the components and supports the components in spaced-apart, non-contacting and electrically insulating relation from the walls of the housing. The frame structure comprises an elongated thin strip of material having two opposing major surfaces and two edges having major portions thereof in opposing relation. The frame structure has slots cut therein along at least one of the edges which slots receive leads of the electronic components. A potting compound may be inserted into the housing. Because the frame structure does not completely enclose the electronic components, the potting compound surrounds the electronic component leaving no air gap between the components and frame structure. Furthermore, because the frame structure spaces the electronic components away from the walls of the housing, no dielectric wrapper is required to surround the inside surface of the walls of the housing and thus the possibility of an air gap existing adjacent the walls of the housing is negated.

In accordance with a broad aspect of the present invention there is provided in a housing for one or more discrete electronic components, the improvement comprising: a dielectric frame structure substantially surrounding the components and supporting the components in spaced-apart, non-contacting and electrically insulating relation from the housing.

In one construction of the present invention, the frame structure may comprise a thin unitary piece of material having two opposing major surfaces and two edges having major portions thereof in opposing relation. Along one of the two edges, slots are cut into the frame structure and the other of the edges engages at least one wall of the housing. In a preferred construction, the slots are cut a predetermined distance into the frame structure so as to locate the electronic components between the major portions of the two edges. In the preferred construction, the two edges engage respective opposing walls of the housing. The slots are V-shaped and terminate in a circular aperture. The aperture has a larger diameter than the narrowest portion of the slot, such that the frame structure is temperarily deformed at each of the slots when the leads of the electronic components are pushed along the edges of the slots into the apertures. The frame structure may comprise a dielectric paper material which is bendable into a shape that accommodates the particular circuit arrangement of the electronic components supported by the frame structure. In another construction, the frame structure may comprise an extruded plastic which is pre-shaped to accommodate the electronic components.

For a better understanding of the nature and objects of the present invention, reference may be had by way of example to the accompanying diagrammatic drawings in which:

FIG. 1 is an exploded isosymmetric view of a metallic can for housing electronic components supported by the frame structure of the present invention;

FIG. 2 is a plan view of the paper frame structure prior to being bent into a predetermined shape;

FIG. 3 is a perspective view of the paper frame structure shown bent into its predetermined shape;

Figure 4:
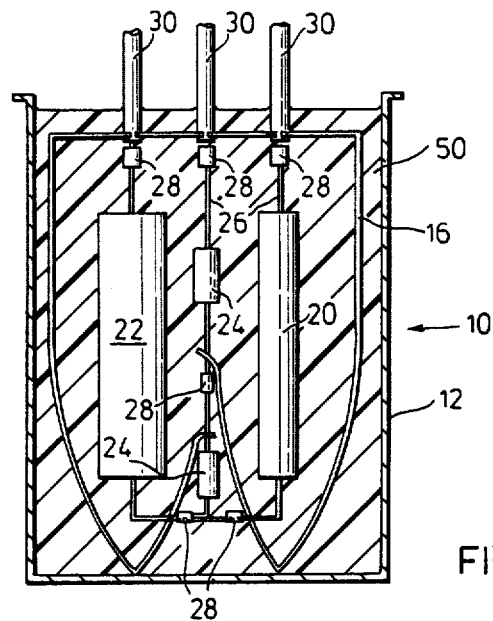
FIG. 4 is a sectional view showing the paper frame structure supporting the electronic components in spaced-apart relation from the can; and, FIG. 5 is a perspective view showing a unitary piece of extruded plastic frame structure. p The preferred embodiment of the present invention shall now be described in detail with reference to FIGS. 1 through 4 of the drawings.

Referring to FIG. 1, a shell type housing comprising a metallic can 10 is shown having a body portion 12. Can 10 is known in the art as a "capacitor can" and is generally oval in shape when seen in end view. A frame structure 16 and a small number of discrete electronic components 18 may be inserted into the body 12 of can 10. By small numbers of electronic components, it is meant that number of electronic components which may be properly supported by the frame structure 16. In this preferred embodiment, the electronic components number 4, and are comprised of a resistor 20, a capacitor 22, and two sidacs 24. The electronic components 18 are interconnected by crimping their non-insulated leads 26. The crimping connectors 28 are shown interconnecting the non-insulated leads 26. Although the particular function of the electronic components is not essential to the invention, the electronic components are arranged in such a fashion to provide an ignitor circuit for a high intensity gaseous discharge lamp. The crimping connectors 28 also interconnect the non-insulated leads 26 with insulated output leads 30. The insulated leads 30 pass through slots 36 in frame structure 16 (see FIG. 4) for interconnection with electrical circuitry of the gasous discharge lamp circuitry. The electronic components 18 are shown surrounded by a frame structure 16.

In FIGS. 1 through 3 the frame structure is shown to comprise an elongated unitary piece of paper having two opposing major surfaces 32a and 32b. The frame structure 16 further includes two edges 34a and 34b. Along one of the edges 34a, V-shaped slots 36 are cut into the frame structure 16. Thus the two edges 34a, 34b have major portions thereof in opposing relation. Slots 36 terminate in circular apertures 38. Each aperture 38 has a larger diameter than the narrowest portion of its respective slot 36. The non-insulated leads 26 interconnecting the electronic components 18 and insulated leads 30 are guided by slots 36 into apertures 38, when leads 26 and 30 are inserted and seated in the apertures 38 of slots 36. Because the frame structure 16 is comprised of a dielectric paper, the narrowest portion of slots 36 temporarily deform to permit the leads 26 and 30 to pass into the circular aperture 38. After the leads 26 and 30 are seated in apertures 38, the edges of slots 36 should move back into position to hold the leads 26 and 30 in place. As shown in FIG. 2, the apertures 38 are located a predetermined distance "d" into the frame structure 16. The choice of "d" illustrated in FIG. 2 results in approximately centering the electronic components 18 between the two edges 34a and 34b of the frame, as may be seen in FIG. 1. This provides for the components 18 to be located between the major portions of the two edges 34a and 34b. The slots 36 and apertures 38 are shown cut into front and rear portions 44 and 46 respectively such that the frame structure 16 substantially surrounds the electronic components 18. End slots 40 are provided at the end portions of the paper frame 16 so as to secure the ends of the paper frame 16 in fixed relation to the electronic components 18.

The electronic components 18 are surrounded and supported by the frame structure 16 such that when the frame structure 16 is inserted into can 10, the frame structure 16 surrounds the electrical components 18 and supports the components 18 in spaced-apart, noncontacting and electrically insulating relation from the walls of can 10. To facilitate the insertion of the frame and components into the can 10, the forward portion of the frame 16, first to enter the can 10, has a tapered contour. The frame structure 16 is substantially prevented from movement within the can 10 because the distance H1 (FIG. 1) between the oposing edges 34a and 34b is equal to the distance H2 between opposing walls of the can such that the opposing portions of the edges of the frame structure contact the walls of can 10. An epoxy resin potting compound is inserted into the can (see FIG. 4) before the paper frame structure 16 and electrical components 18 have been inserted into the can. As more clearly shown in FIG. 4, the preassembled electronic components are interconnected by crimping connectors 28. Interconnection of the components by crimping connectors 28 eliminates the soldering of the electronic components which eliminates all environmental hazards associated therewith. Furthermore, connection of the components may be achieved much more readily by a crimping machine than the manual soldering of the components. It is quite evident from FIG. 4 that the epoxy resin potting compound 50 will completely surround the electronic components and will also be in direct contact with the walls of the can. The epoxy compound has good thermal conductivity properties and has good electrical insulating properties so that heat is readily transferred from the electronic components to the environment surrounding the can 10 and so that, in the event of a short circuit in one of the electronic components, the can 10 will not act as a ground for such a short circuit. To this end, the paper frame structure 16 ensures that the electronic components do not come into contacting relation with the walls of the can 10. Furthermore, the paper frame structure is relatively inexpensive, presently costing about one-fifteenth the cost of a printed circuit board.

It should be understood that in alternate embodiments the leads may be spot-welded together by a multiheaded machine which would make all these connections on one stroke thereby further reducing labour costs.

Figure 5:
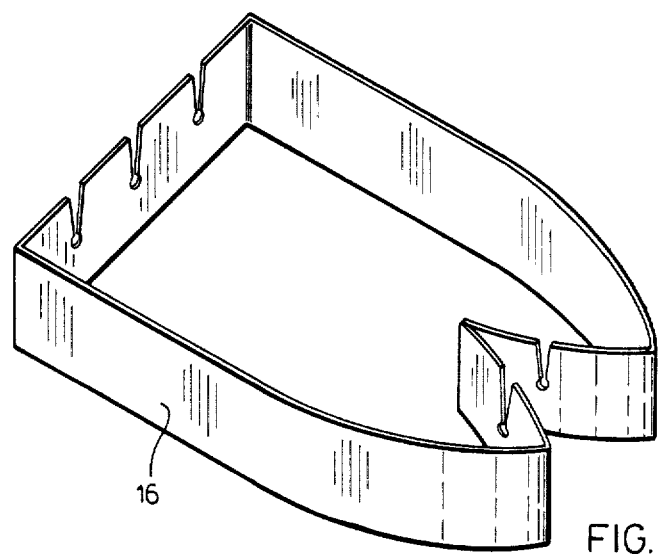

Referring now to FIG. 5 there is shown an alternate construction for the present invention wherein an extruded plastic material is used to form the frame structure 16 of the present invention.

It should be understood that alternate embodiments may be readily apparent to a man skilled in the art in the light of the teachings of the present disclosure. Accordingly, the invention should only be limited to that which is claimed in the accompanying claims.

While the present invention has been described with reference to particular embodiments thereof, it will be understood that numerous modifications may be made by those skilled in the art without departing from the scope of the invention. Therefore, the appended claims are intended to cover all such equivalent variations as come within the true spirit and scope of the invention.

What I claim as new and desire to secure by Letters Patent of the United States is:

1. A potted electronic circuit component assembly comprising:
    a shell-type metal housing having curving walls,
    discrete electronic components within the housing having wire leads and connected in a circuit,
    a frame structure formed of a thin strip of dielectric material having two opposing major portions surrounding said components, the edges of the strip in said major portions engaging the walls of the housing to locate the structure within the housing and assure space between the curving wall and the strip portions,
    said strip of dielectric material having V-shaped slots cut therein from an edge and terminating in apertures accommodating said wire leads to support said components in a spaced-apart, non-contacting and electrically insulating manner relative to the walls of said housing,
    and an electrically insulating and thermally conductive compound filling the empty spaces within said housing to provide heat transfer between said components and the walls of said housing.

2. An assembly as in claim 1 wherein non-insulated leads are used and are interconnected by crimping.

3. An assembly as in claim 1 wherein said slots are cut a predetermined distance into the strip of dielectric material to approximately center said components between the edges of the strip.

4. An assembly as in claim 1 wherein said frame structure is formed of insulating paper bent to a shape accommodating said components.

5. An assembly as in claim 1 wherein the V-shaped slots terminate in circular apertures having a diameter larger than the narrowest portion of the slot and such that the strip material temporarily deforms when the leads are forced through the slots into the apertures.

6. An assembly as in claim 1 wherein said frame structure has a front portion contoured to a facilitate insertion into the metal housing.

7. An assembly as in claim 1 wherein said frame structure has front and rear portions, said V-shaped slots being cut only into said front and rear portions.

8. An assembly as in claim 1 wherein said frame structure is formed of extruded plastic material.

* * * * *